(12) United States Patent
Liu et al.

(10) Patent No.: US 7,106,587 B2
(45) Date of Patent: Sep. 12, 2006

(54) FLUID MOVING DEVICE WITH A RADIATION MODULE

(75) Inventors: Wen-Hao Liu, Taipei (TW); Cheng-Chang Huang, Taipei (TW)

(73) Assignee: Asia Vital Component Co., Ltd., Koahsiung (TW)

(*) Notice: Subject to any disclaimer, the term of this patent is extended or adjusted under 35 U.S.C. 154(b) by 0 days.

(21) Appl. No.: 11/000,959

(22) Filed: Dec. 2, 2004

(65) Prior Publication Data

US 2006/0120042 A1    Jun. 8, 2006

(51) Int. Cl.
*H05K 7/20* (2006.01)
*F04B 17/00* (2006.01)
*F04B 49/00* (2006.01)
*F28F 7/00* (2006.01)

(52) U.S. Cl. ............ 361/697; 361/695; 417/354; 417/220; 165/80.3

(58) Field of Classification Search ........ 361/694, 361/695, 697, 722; 257/703; 165/80.3, 165/121, 122; 415/176–178, 78, 220; 417/354, 417/271

See application file for complete search history.

(56) References Cited

U.S. PATENT DOCUMENTS

| | | | | |
|---|---|---|---|---|
| 6,020,820 A | * | 2/2000 | Chiang | 340/584 |
| 6,386,276 B1 | * | 5/2002 | Chen et al. | 165/121 |
| 6,520,250 B1 | * | 2/2003 | Lee et al. | 165/121 |
| 6,585,485 B1 | * | 7/2003 | Lee et al. | 415/203 |
| 6,869,269 B1 | * | 3/2005 | Huang et al. | 415/116 |
| 2005/0141992 A1 | * | 6/2005 | Lin | 415/176 |

* cited by examiner

*Primary Examiner*—Lisa Lea-Edmonds
*Assistant Examiner*—Zachary Pape

(57) ABSTRACT

A fluid moving device with a heat radiation, which is mounted to a conductive part to dissipate heat from a heat generation part under the fluid moving device and another heat generation part around the first heat generation part, includes a first frame member, which has an area thereof being equal to that of the conductive part and a base member being movably attached with the fan wheel, and a second frame member, which has a second hollow part with an area thereof being greater than the first frame member and provides a projection section extending beyond four sides of the first frame member. Once the fan wheel rotates, the fluid is dragged to enter the fluid moving device via the second hollow part and to leave via the first hollow part so as to dissipate heat in and around the conductive part.

6 Claims, 11 Drawing Sheets

FLUID MOVING DEVICE WITH A RADIATION MODULE

BACKGROUND OF THE INVENTION

1. Field of the Invention

The present invention is related to a fluid moving device with a radiation module and particularly to a fluid moving device, which is attached to a radiator, capable of dissipating heat in a conductive part and from a heat generation part around the conductive part.

2. Brief Description of the Related Art

Due to electronic components being improved to satisfy new demands of the users, performances of the electronic components have become much more powerful, and processing speed thereof becomes much more faster.

However, especially in the computer, the electronic components such as the central processing unit (CPU) and the north bridge chip beside the CPU on the main board are easy to produce high heat in company with the enhanced performance and the faster processing speed. The generated high heat seriously affects the performances of preceding electronic components and the life spans of the electronic components are shortened significantly if the heat generated from the electronic components is not removed rapidly. In order to remove the heat from preceding high heat generation components, a heat dissipation device is usually employed for this purpose. The most popularly used heat dissipation devices are the fan and the radiator. Mostly, the fan associated with the radiator is capable of obtaining better effect for heat removal.

Taiwanese Patent Official Gazette No. 527089, entitled "GUIDE FLOW DEVICE WITH A RADIATION DEVICE", has a guide flow pipe with a front opening, a rear opening and a plurality of inner guide flow plates. The front opening provides an area greater than the rear opening and connects with an outlet of the fan. The rear opening is connected to the cooling fins. When the fan rotates to drag the air into the guide flow pipe via the front opening, the air then passes through the guide flow plates and flows outward via the rear opening to carry heat at the cooling fins out.

The problem of the preceding conventional structure resides in that there is a clearance between the big sized cooling fan and the cooling fins resulting from the guide flow pipe interposing in between. When the fan is running, the guide flow pipe at the side of the fan and at the side of cooling fins vibrates with noise of more sound decibels. Further, material cost and labor cost have to be increased due to the guide flow pipe being connected to the fan and cooling fins. Besides, the inner wall of the guide flow pipe is provided with a trumpet shape such that the fluid is easy to impact the inner wall of the guide flow pipe. As a result, much noise is created and backflow is produced. In this way, heat dissipation efficiency is affected by the backflow.

SUMMARY OF THE INVENTION

An object of the present invention is to provide a fluid moving device with a radiation module, which allows a big sized fan wheel capable of being attached to a small sized conductive part.

Another object of the present invention is to provide a fluid moving device with a radiation module in which the fluid flow area can be expanded to cool the conducive part below the fan wheel and the heat generation part around the conductive part.

A further object of the present invention is to provide a fluid moving device with a radiation module in which flow rate is increased to enhance heat dissipation efficiency under conditions of the performance of motor without being promoted and the fan wheel without being redesigned specifically.

A further object of the present invention is to provide a fluid moving device with a radiation module in which power consumption is saved and costs of material and fabrication are lowered effectively.

In order to achieve the preceding objects, the fluid moving device with a radiation module according to the present invention comprises a fan wheel, a first frame member, a second frame member, a base member and a plurality of joining parts. The first frame member integrally connects with the second frame and is fastened to the conductive part by means of connecting components passing through the joining parts. The first frame member is hollow and provides an area equal to the conductive part. The second frame member is hollow and provides an area being greater than the first frame member such that a projection section extends outward beyond four sides of the first frame member. Once the fan wheel rotates, the fluid is dragged into the conductive part directly to cool the heat generation part under the conductive part via the second frame member and the first frame member and dragged downward via the respective projection section to cool another heat generation part surrounding the heat generation part attached to the conductive part via the respective projection section.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
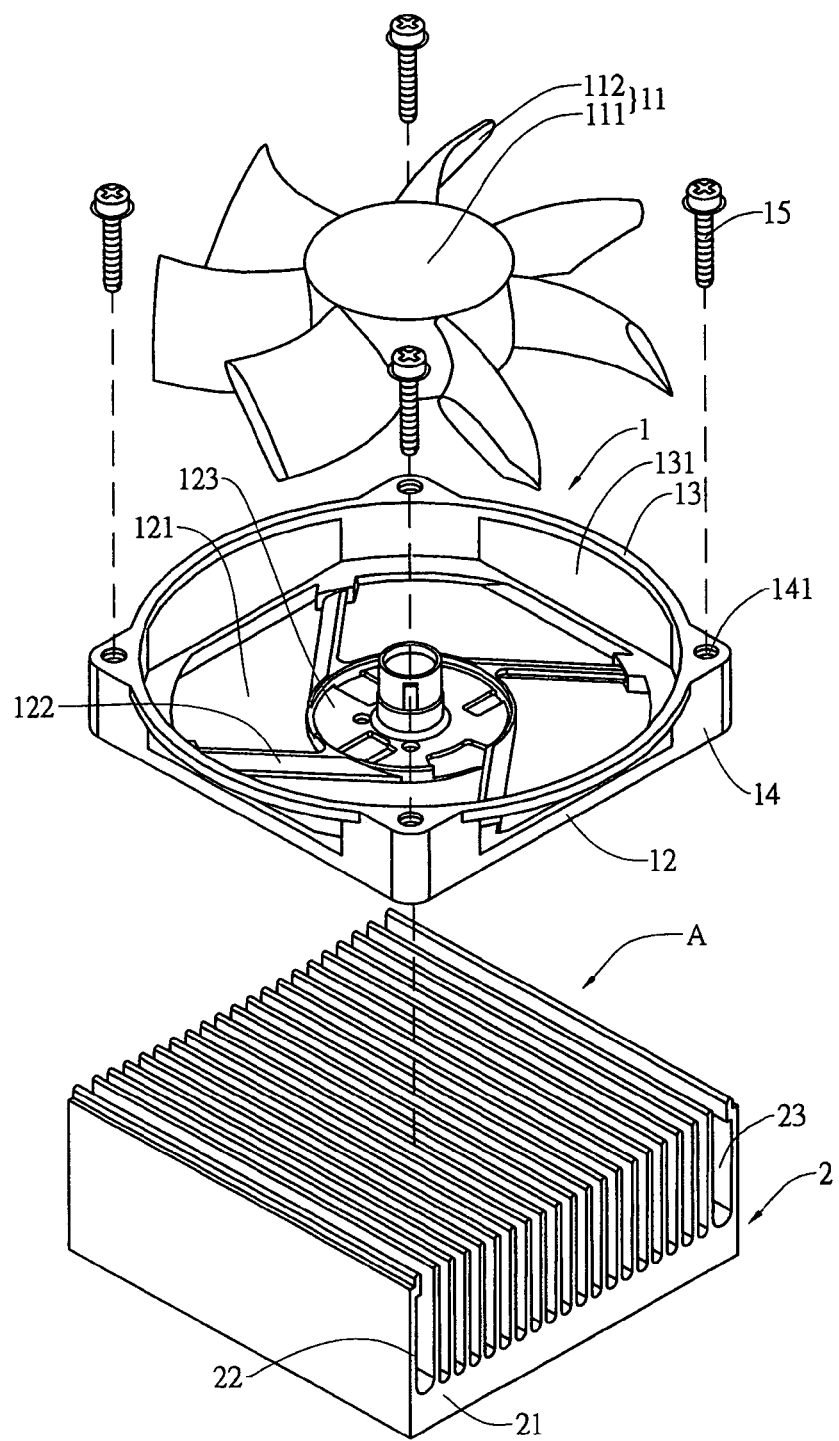
FIG. 1 is an exploded perspective view of the first embodiment of a fluid flow device with a radiation module according to the present invention.
Figure 2:
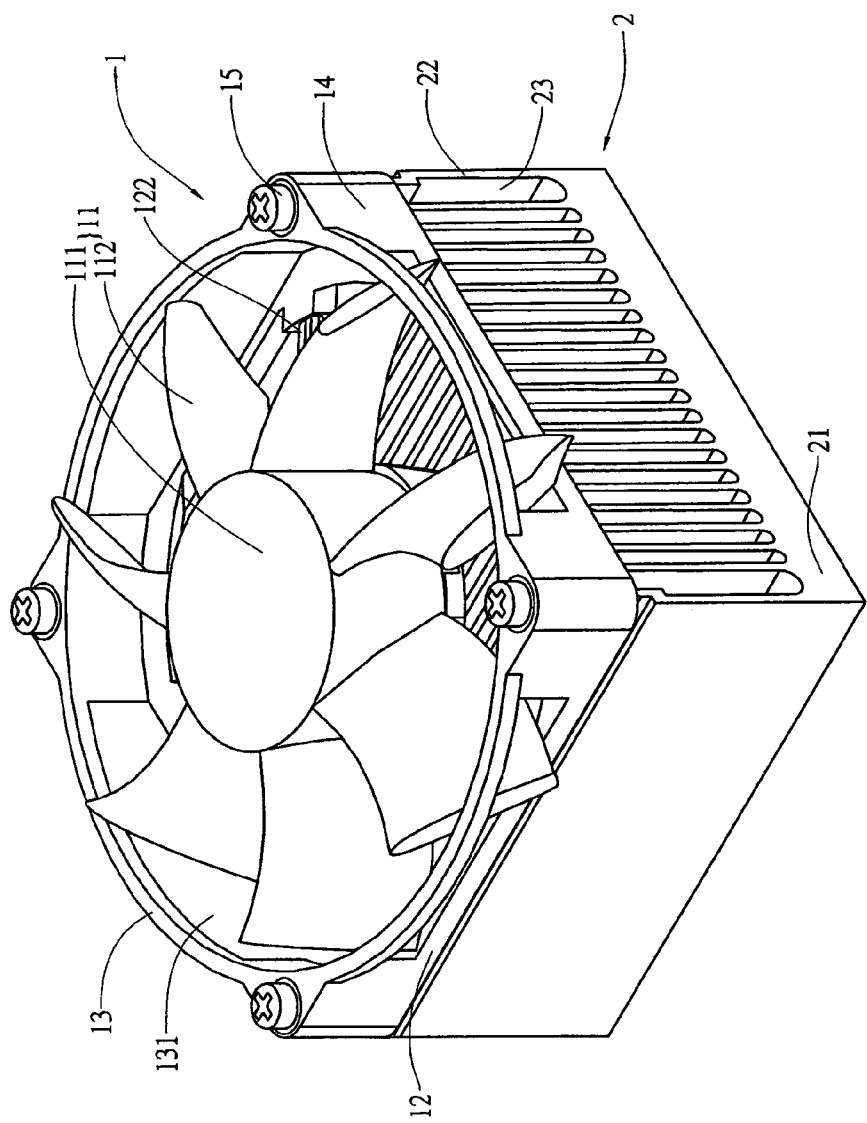
FIG. 2 is an assembled perspective view of the first embodiment of a fluid flow device with a radiation module according to the present invention.
Figure 3:
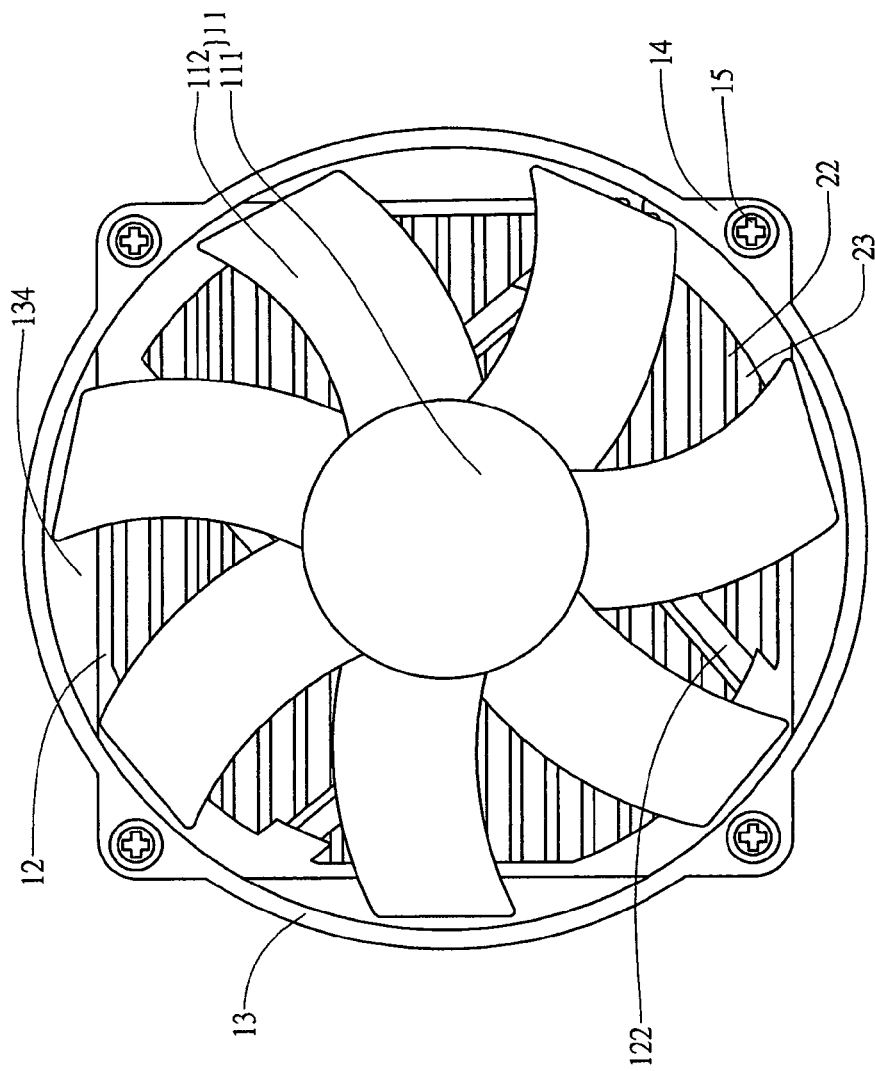
FIG. 3 is a top view of the first embodiment of a fluid flow device with a radiation module according to the present invention.

Referring to FIGS. 1 and 2, the first embodiment of a fluid flow device with a radiation module according to the present invention comprises a fluid flow device 1 and a conductive part 2. The fluid flow device 1 further comprises a fan wheel 11 and a frame composed of a first frame member 12, a base member 123, a second frame member 13 and a plurality of joining parts 14. The fan wheel 11 has a hub 111 and a plurality of fan blades radially extending from the hub 111. The first frame member 12 provides a first hollow part 121 and a plurality of connecting members 122. The connecting members 122 are rib bars shown in the present embodiment with each of the rib bars being joined to the inner edge of the first frame member 13 at one end thereof respectively and being joined to the base member 123 at another end thereof respectively. The fan wheel 11 is rotationally attached to the base member 123. The second frame member 13 has a second hollow part 131 and the second hollow part 131 has an area greater than the first frame 12 respectively such that a projection section 134 is formed to extend outward beyond four sides of the first frame member 12 as shown in FIG. 3. The joining parts 14 provide a through hole 141 respectively for being penetrated with an engaging component 15 respectively.

The conductive part 2 shown in the present embodiment is a radiator, which has a base 21 and a plurality of cooling fins 22 being disposed in parallel and spaced apart from each other respectively. Hence, a flow passage 23 is formed for the fluid being able to move along the flow passage 23. Each of the cooling fins 22 has a heat receiving surface A at the top thereof respectively and the heat receiving surface A is a rectangular shape for contacting with the first frame member 12.

Referring to FIG. 3, the first frame member 12 provides a right quadrilateral shape and the area formed by the first frame member 12 is equal to the gross area of the respective heat receiving surface A. It can be seen from FIG. 3 that the projection section 134 juts out of the first frame member 12 and the four sides of the conductive part 2 and there is a hollow space among the first frame member 12, the second frame member 13 and the joining part 14 such that the fluid can move through the hollow space. Further, the area of the second frame member 13, which is greater than the first frame member 12, can receive the fan wheel, which provides a size greater than the gross area of the respective heat receiving surface A. The joining parts 14 are located at four corners of the first frame member 12 and the through hole 141 in each of the joining parts 14 can be penetrated with an engaging component 15 so that the first frame member 12, the second frame member 13, the fan wheel 11 and the joining part 14 can be joined to the heat receiving surface A on each of the cooling fins 22 of the conductive part 2.

Figure 4:
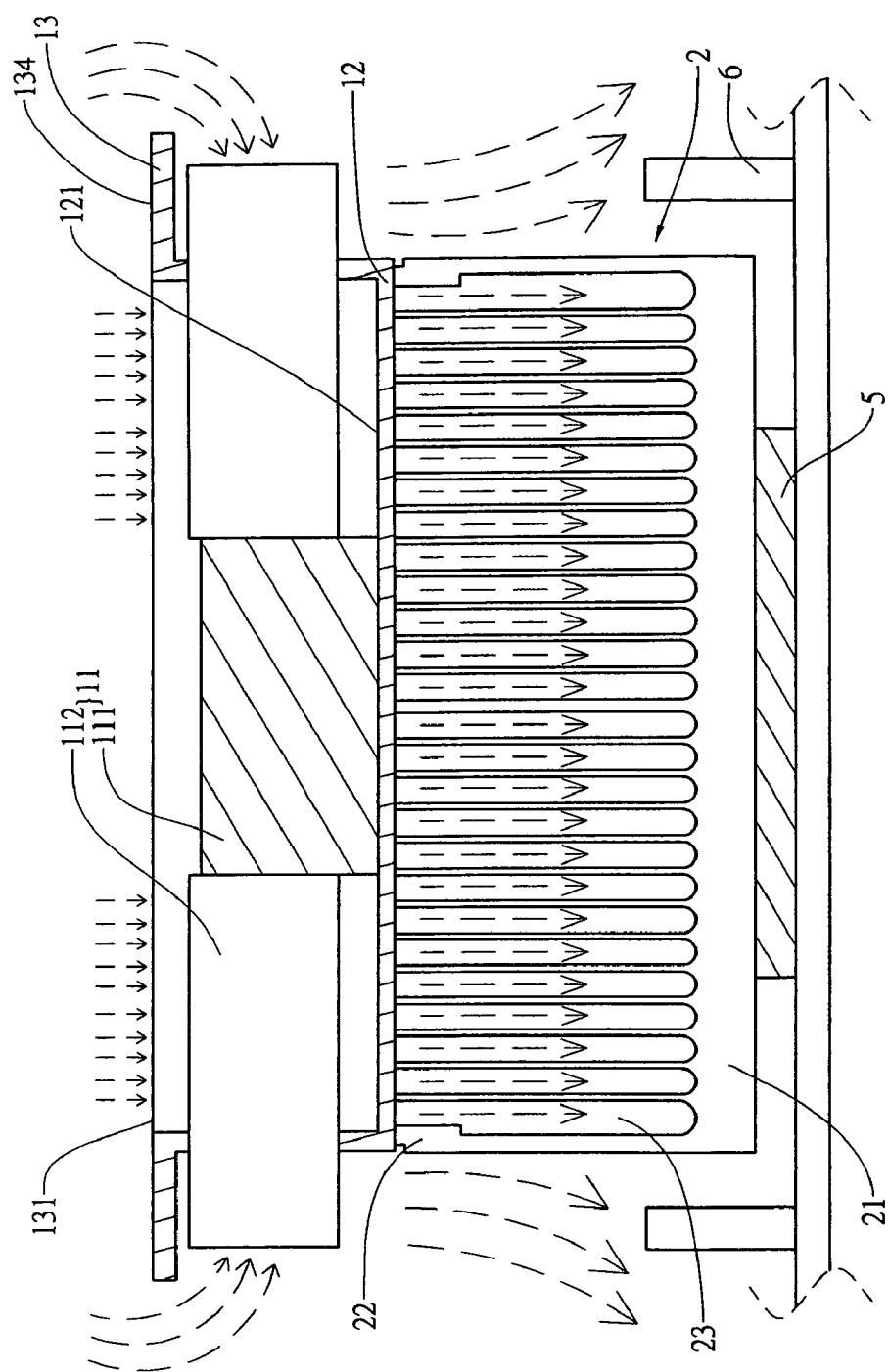
FIG. 4 is a plan view of the first embodiment of a fluid flow device with a radiation module according to the present invention illustrating being applied to a heat generation component.
Figure 5:
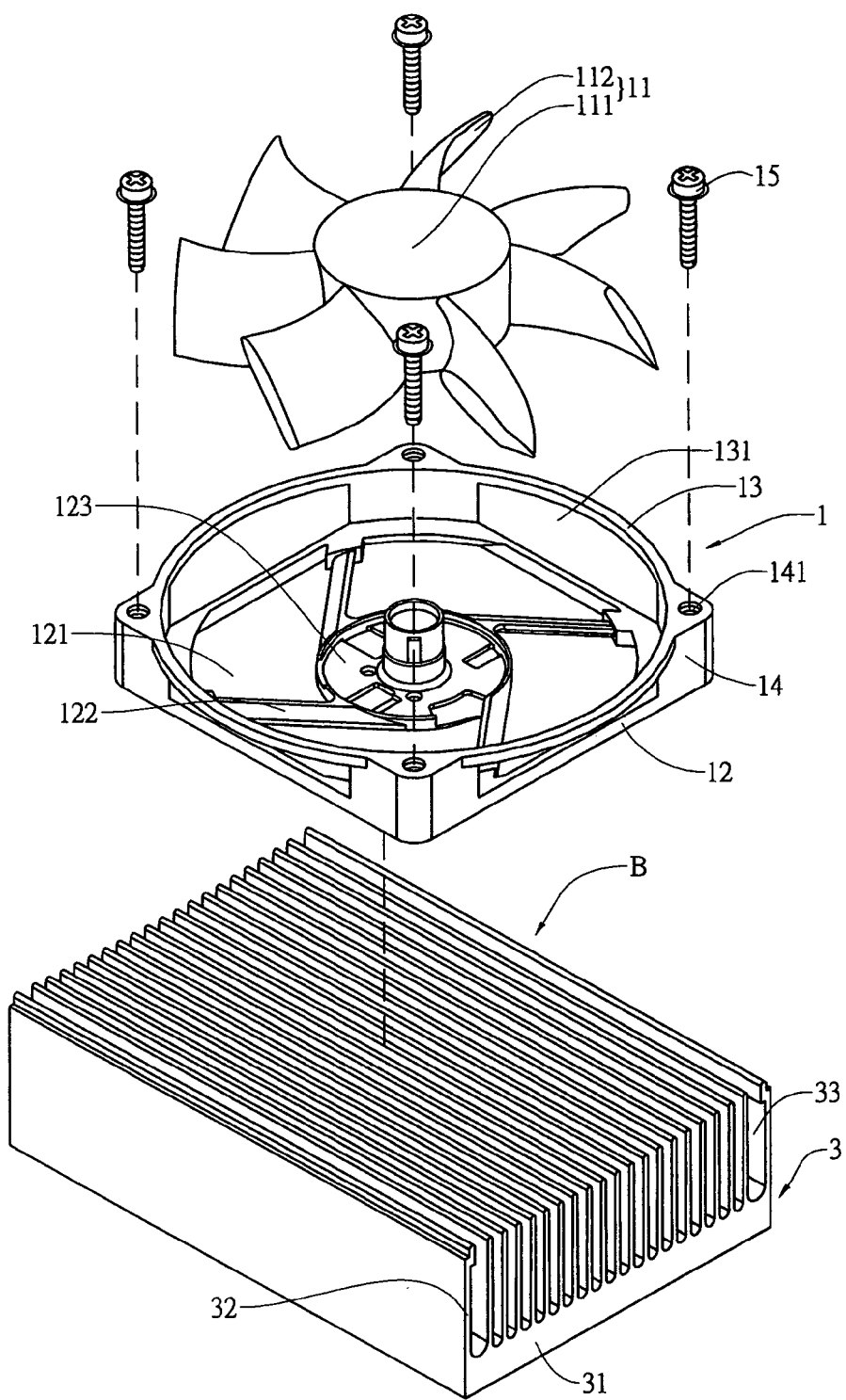
FIG. 5 is an exploded perspective view of the second embodiment of a fluid flow device with a radiation module according to the present invention.
Figure 6:
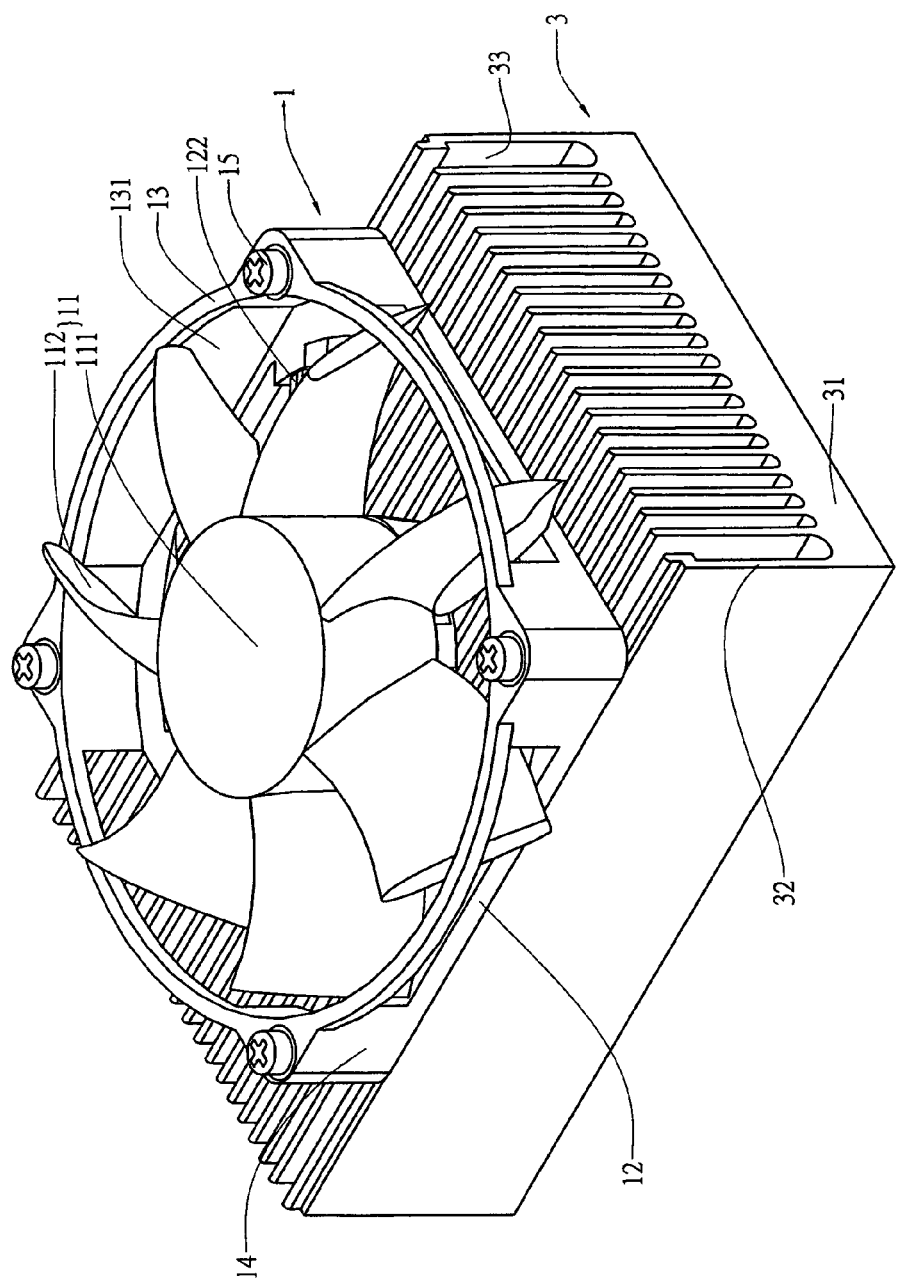
FIG. 6 is an assembled perspective view of the second embodiment of a fluid flow device with a radiation module according to the present invention.
Figure 7:
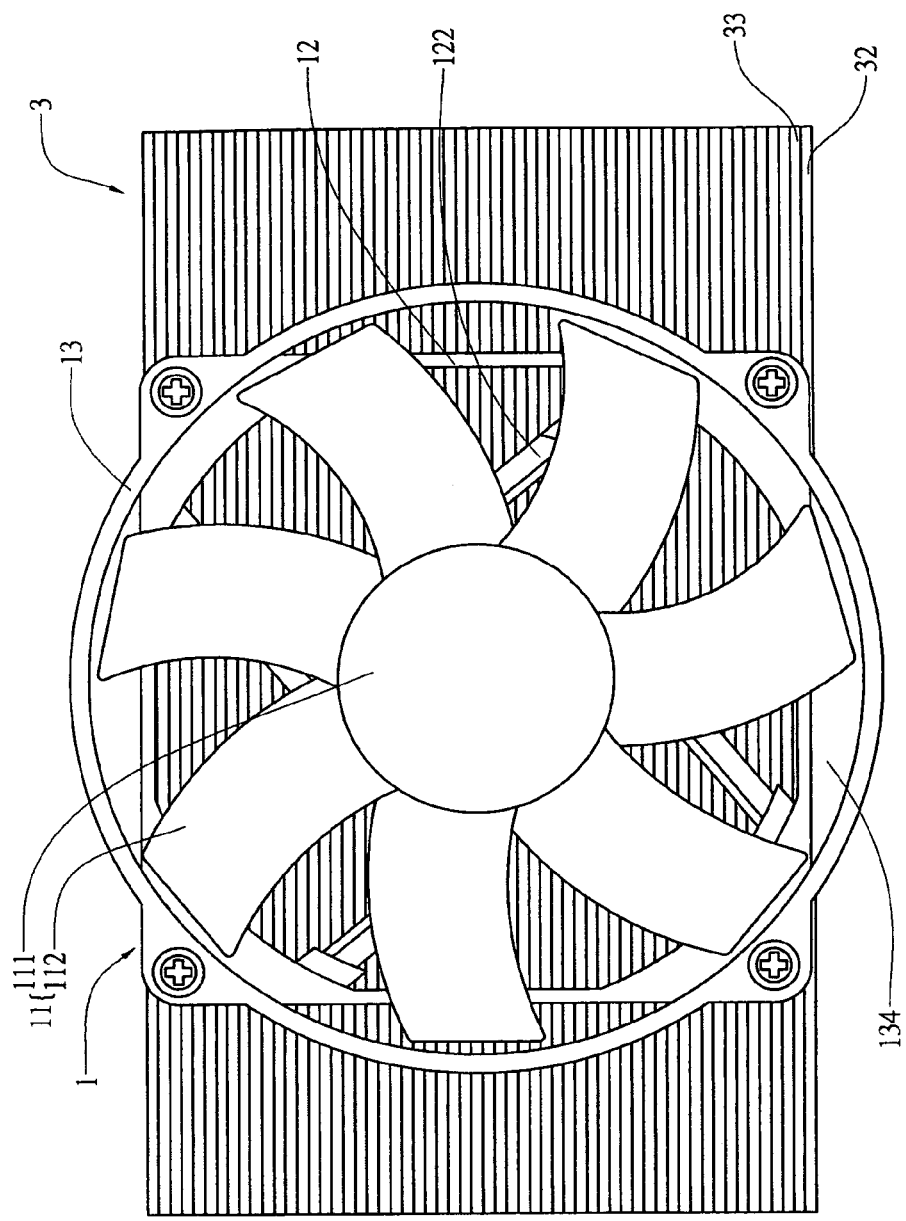
FIG. 7 is a top view of the second embodiment of a fluid flow device with a radiation module according to the present invention.
Figure 8:
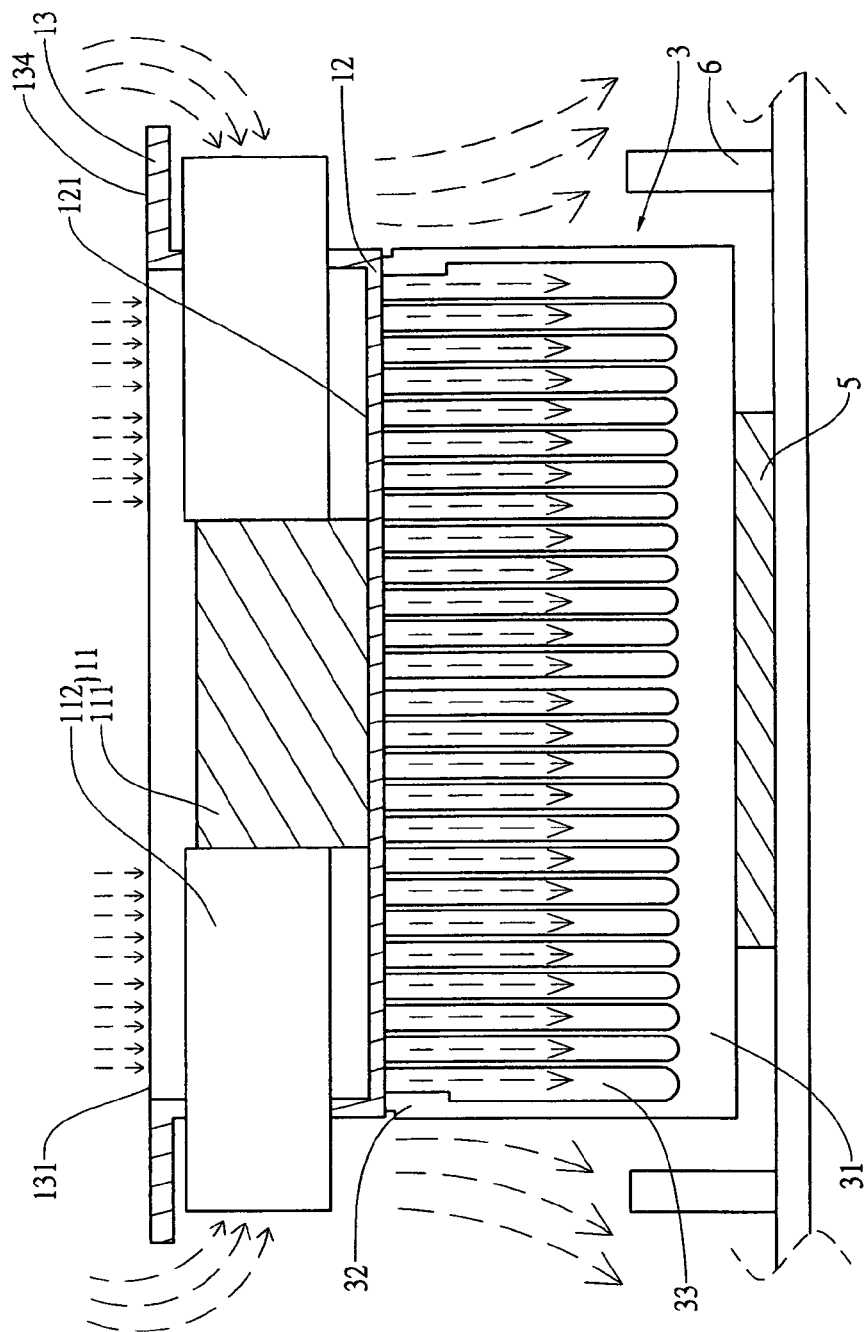
FIG. 8 is a plan view of the second embodiment of a fluid flow device with a radiation module according to the present invention illustrating being applied to a heat generation component.

Referring to FIG. 4 in company with FIGS. 1 and 3, the first embodiment of the present invention applied to heat generation parts 5 and 6 is illustrated. The base 21 of conductive part 2 is disposed on top of and closely attached to the heat generation part 5 and the conductive part 2 is surrounded by the heat generation part 6. Heat from the heat generation part 5 can be transmitted by the conductive part 2. Once the fan wheel 11 rotates, the fluid is dragged into the fluid moving device via the second hollow part 131 and the fluid enters the conductive part 2 directly via the first hollow part 121 and enters the heat generation part 6 via the respective projection section 134 of the second frame member 13. Hence, the flow rate down to the conductive part 3 and the heat generation part 6 increases and the fluid from the first hollow part 121 moves toward conductive part 2 to assist dissipation of heat from the heat generation part 5 indirectly. The fluid from the projection section 134 flows toward the heat generation part 6 surrounding the conductive part 2 to assist dissipation of heat from the heat generation part 6. In this way, the disadvantage of the big sized fan being mounted to small sized cooling fins by means of a guide flow pipe done in the prior art can be overcome and the dissipation of heat from the heat generation part 5 under the conductive part 2 and from the heat generation part 6 surrounding the conductive component 2 can be carried simply with the fluid flow device 1 of the present invention. Further, the flow rate can be increased without promoting performance of the motor redesigning the fan wheel. As the forgoing, the invention has advantages such as providing higher heat dissipation efficiency, lessening fabricating cost and saving power consumption.

Referring to FIGS. 5 to 8, the second embodiment of a fluid flow device with a radiation module according to the present invention is illustrated. The second embodiment provides a structure and function similar to the first embodiment and it is noted that parts with identical reference numbers will be not described further. The conductive part 2 shown in the present embodiment is a radiator, which has a base 31 and a plurality of cooling fins 32 being disposed in parallel and spaced apart from each other respectively. Hence, a flow passage 33 is formed for the fluid being able to move along with the flow passage 33. Each of the cooling fins 22 has a heat receiving surface B at the top thereof respectively and the receiving surface B is provided with two long sides and two short sides the two long sides having both ends thereof connecting with the two short sides respectively. Thus, an area enclosed by the first frame member 12 is less than gross top area of the conductive part 3. The projection section 134 of the second frame member 13 juts out beyond the two long sides. Hence, once the fan wheel rotates to drag the fluid moving toward the conductive part 3 at the first hollow part 121 to assist dissipation of heat from the heat generation part 5 and the projection section 134 allows part of the fluid to flow to the heat generation part 6 surrounding the conductive part 3 so as to assist dissipation of heat from the heat generation part 6. Further, due to the area affected by the fluid increasing, the forced convection area on the conductive part 3 increases so that conductive efficiency of the conductive part 3 to the heat generation part 5 and due to the fluid moving area along the longitudinal direction of the conductive component increasing, the heat dissipation efficiency is enhanced effectively.

Figure 9:
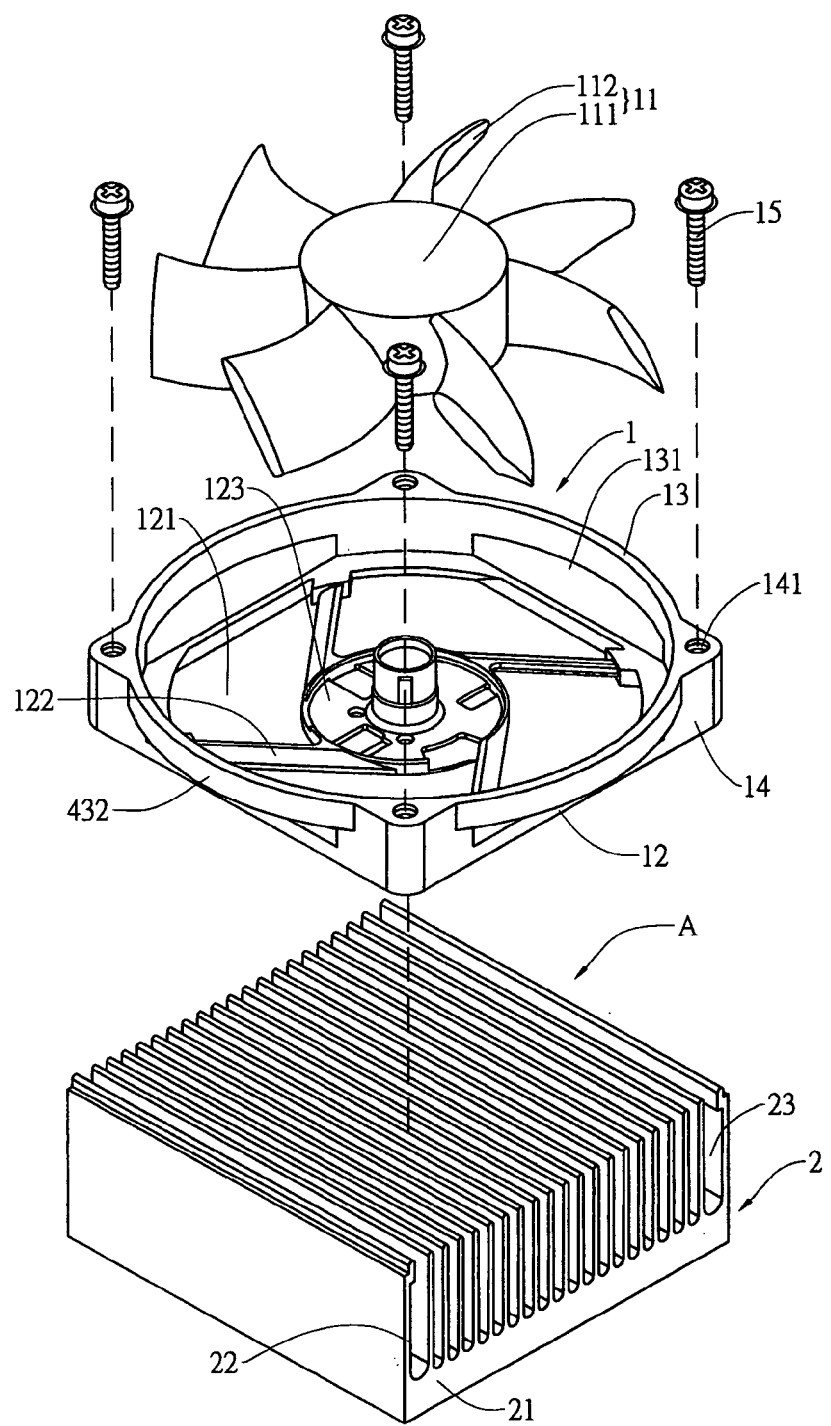
FIG. 9 is an exploded perspective view of the third embodiment of a fluid flow device with a radiation module according to the present invention.
Figure 10:
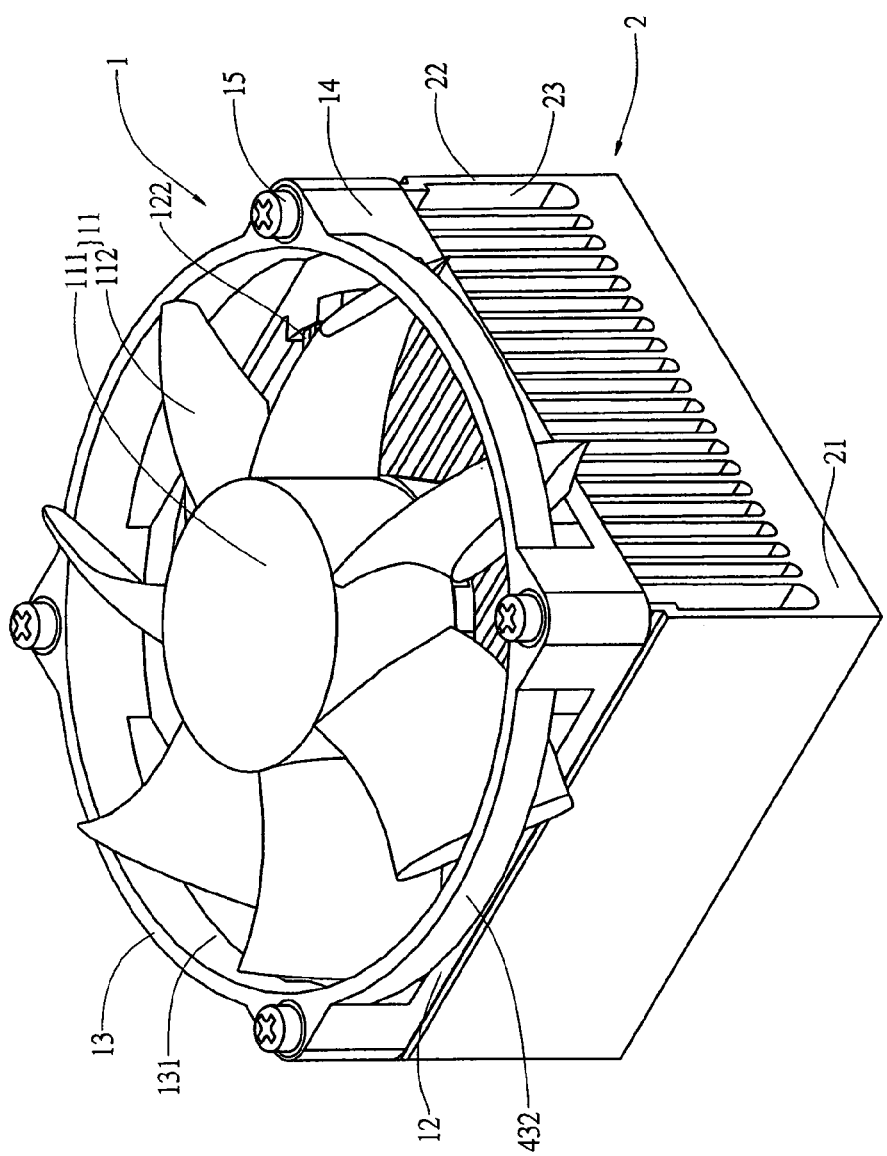
FIG. 10 is an assembled perspective view of the third embodiment of a fluid flow device with a radiation module according to the present invention.
Figure 11:
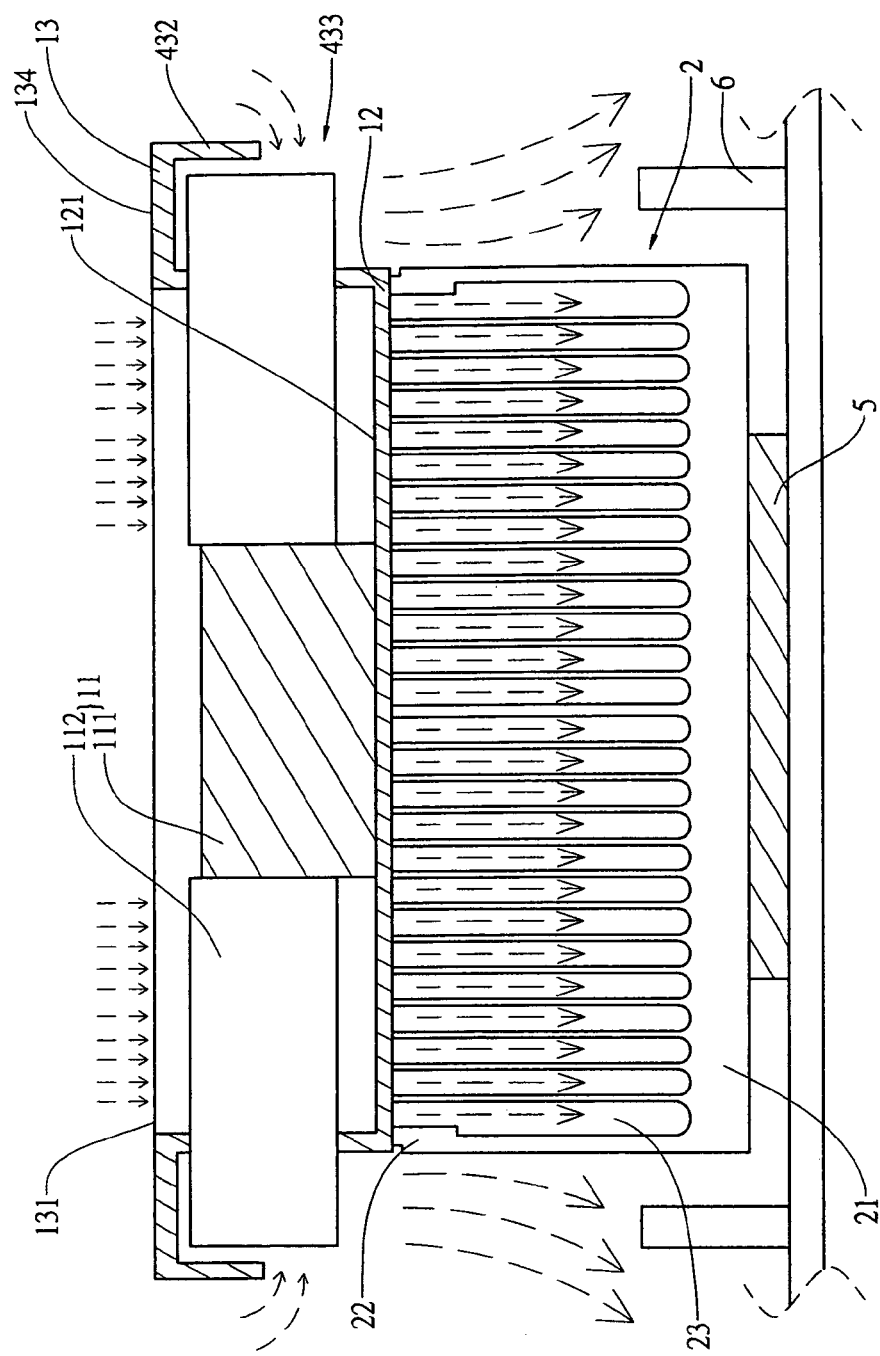
FIG. 11 is a plan view of the third embodiment of a fluid flow device with a radiation module according to the present invention illustrating being applied to a heat generation component.

Referring to FIGS. 9, 10 and 11, the third embodiment of a fluid flow device with a radiation module according to the present invention is illustrated. The third embodiment provides a structure and function similar to the preceding embodiments and it is noted that parts with identical reference numbers will be not described further. The difference of the third embodiment is in that the second frame ember 13 is formed with a projection section 432 downward the first frame member 12 and a hollow space 433 is formed between the tail end of the projection section 432 and the second frame member 12. When the fan wheel 11 rotates, the fluid can flow through the hollow space 433 to increase incoming flow rate and the projection section 432 can offer a function of super charging to increase pressure of the fluid and enhance effect of heat dissipation.

While the invention has been described with referencing to preferred embodiments thereof, it is to be understood that modifications or variations may be easily made without departing from the spirit of this invention, which is defined by the appended claims.

What is claimed is:

1. A fluid moving device with a radiation module, comprising:
   a hollow frame, providing a first frame member, which is quadrilateral with four corners, a joining part with a fixing hole extending upward from the corners respectively, a second frame member, which is annular, being disposed above the first frame member and integrally joined to the joining part;
   a base member, being disposed at a center of the first frame member and being joined to the first frame member with a plurality of bars;
   a fan wheel with a plurality of fan blades, being disposed in the frame and rotationally attached to the base member; and
   a quadrilateral heat conductive part, engaging with the frame by means of an engaging component passing through the fixing hole respectively, having a base with a plurality of cooling fins extending upright in parallel and spacing to each other and a top side of each of the cooling fins contacting with the first frame member;
   characterized in that an area enclosed by the first frame member is the same as a top area of the conductive part, an area enclosed by the second frame member is greater than an area enclosed by the first frame member such that the second frame member extends beyond four lateral sides of the first frame member for fluid dragged by the fan wheel flowing downward toward a heat generation part surrounding the conductive part in addition to flowing downward directly to the heat conductive part toward another heat generation part under the heat conductive part.

2. The fluid moving device with a radiation module as defined in claim 1, wherein an area enclosed by a periphery of the fan wheel is greater than an area enclosed by the first frame member.

3. The fluid moving device with a radiation module as defined in claim 1, wherein the second frame member extends downward an enclosing section respectively to form a space between the fan wheel and the enclosing section for increasing flow rate dragged from circumferential side of the fan wheel with a function of super charging.

4. A fluid moving device with a radiation module, comprising:
   a hollow frame, providing a first frame member, which is quadrilateral with four corners, a joining part with a fixing hole extending upward from the corners respectively, a second frame member, which is annular, being disposed above the first frame member and integrally joined to the joining part;
   a base member, being disposed at a center of the first frame member and being joined to the first frame member with a plurality of bars;
   a fan wheel with a plurality of fan blades, being disposed in the frame and rotationally attached to the base member; and
   a quadrilateral heat conductive part with two opposite short sides and two opposite long sides, engaging with the frame by means of an engaging component passing through the fixing hole respectively, having a base with a plurality of cooling fins extending upright in parallel and spacing to each other and a top side of each of the cooling fins contacting with the first frame member;
   characterized in that an area enclosed by the first frame member is less than a top area of the heat conductive part with each of the two short sides of the heat conductive part being equal to each side of the first frame member, an area enclosed by the second frame member is greater than an area enclosed by the first frame member such that the second frame member extends beyond the two long sides for fluid dragged by the fan wheel flowing downward toward a heat generation part surrounding the heat conductive part in addition to flowing downward directly to the heat conductive part toward another heat generation part under the heat conductive part.

5. The fluid moving device with a radiation module as defined in claim 4, wherein an area enclosed by a periphery of the fan wheel is greater than an area enclosed by the first frame member.

6. The fluid moving device with a radiation module as defined in claim 4, wherein the second frame member extends downward an enclosing section respectively to form a space between the fan wheel and the enclosing section for increasing flow rate dragged from circumferential side of the fan wheel with a function of super charging.

* * * * *